(12) United States Patent
Salinas et al.

(10) Patent No.: US 8,028,709 B2
(45) Date of Patent: Oct. 4, 2011

(54) PHOTORESIST DISPENSER WITH NOZZLE ARRANGEMENT FOR CONE-SHAPED SPRAY

(75) Inventors: Adrian Salinas, Garland, TX (US); Joel Peterson, Pottsboro, TX (US)

(73) Assignee: Texas Instruments Incorporated, Dallas, TX (US)

( * ) Notice: Subject to any disclaimer, the term of this patent is extended or adjusted under 35 U.S.C. 154(b) by 65 days.

(21) Appl. No.: 12/351,987

(22) Filed: Jan. 12, 2009

(65) Prior Publication Data

US 2010/0175722 A1 Jul. 15, 2010

(51) Int. Cl.
*B08B 3/04* (2006.01)
*B08B 3/00* (2006.01)
*B08B 3/12* (2006.01)
*B08B 6/00* (2006.01)
*B05C 11/00* (2006.01)
*B05C 13/00* (2006.01)
*B05C 13/02* (2006.01)

(52) U.S. Cl. .................. 134/104.1; 134/199; 118/70

(58) Field of Classification Search ............... 134/104.1, 134/199; 118/70
See application file for complete search history.

(56) References Cited

U.S. PATENT DOCUMENTS

| 4,033,869 | A | * | 7/1977 | McGrew | 210/767 |
| 4,674,521 | A | * | 6/1987 | Paulfus | 134/167 R |
| 6,398,879 | B1 | * | 6/2002 | Satou et al. | 134/33 |
| 6,599,560 | B1 | | 7/2003 | Daggett et al. | |
| 7,157,386 | B2 | | 1/2007 | Andres et al. | |
| 2003/0221712 | A1 | * | 12/2003 | Yang et al. | 134/34 |

FOREIGN PATENT DOCUMENTS

JP 2002143749 A * 5/2002

* cited by examiner

*Primary Examiner* — Michael Barr
*Assistant Examiner* — Charles W Kling
(74) *Attorney, Agent, or Firm* — Warren L. Franz; Wade J. Brady, III; Frederick J. Telecky, Jr.

(57) ABSTRACT

A cleaning system which can be integrated into a coater track system for use in the production of semiconductor devices and methods for its use are provided. The cleaning system can include a series of nozzles having assorted configurations and features which provide uniform and efficient rinsing of excess material.

17 Claims, 3 Drawing Sheets

PHOTORESIST DISPENSER WITH NOZZLE ARRANGEMENT FOR CONE-SHAPED SPRAY

FIELD OF THE INVENTION

This invention relates to the field of semiconductor device manufacture, and more particularly to equipment used to dispense a fluid such as photoresist onto a semiconductor wafer in preparation for lithographic processing.

BACKGROUND OF THE INVENTION

The manufacture of semiconductor devices is an equipment-intensive venture. The expense of purchasing, maintaining, and repairing production equipment adds significantly to the final cost of semiconductor devices. Equipment technicians are employed to maintain and keep equipment in working order, which minimizes unexpected failures and decreases downtime. Equipment must be removed from production for both maintenance and repair, and increasing the percentage of time equipment remains in production decreases costs and is a goal of equipment engineers and semiconductor fab managers.

Production of semiconductor devices requires photolithographic processing to provide repetitive, patterned features on the surface of the semiconductor wafer. During photolithography, a semiconductor wafer is coated with photosensitive photoresist (resist), then the resist is exposed to a light pattern to alter the chemical makeup of the resist. After exposure of the resist to light, the coated wafer is rinsed with a developer to leave a pattern of resist material over the wafer surface. The patterned photoresist can then be used to etch underlying materials.

To coat the wafer surface with photoresist, a coater track system can be used. A number of photoresist track systems are produced by various manufacturers, for example the POLARIS® P2000 lithography coat system, available from FSI International of Allen, Tex. To coat the wafer with photoresist, a semiconductor wafer is placed onto a chuck within the track system. The chuck spins the wafer, and photoresist is applied to the top of the wafer through a dispensing nozzle which is part of a bowl rinse hardware assembly. The rotation of the wafer results in a uniform, thin coating of resist over the wafer surface. Any excess photoresist is removed from the wafer by centrifugal forces during application, and is contained within a coater cup.

During repeated photoresist applications to a number of different wafers, a buildup of excess resist on various interior surfaces of the coater process bowl system can result, which must be cleaned away. A coater process bowl system typically comprises an automated bowl rinse hardware assembly which periodically rinses the coated surfaces of the coater process bowl system to prevent buildup of excess photoresist. The FIG. 1 cross section depicts a coater process bowl system 10. A deflector 12 is spaced from a baffle 14 to provide a gap 16 which opens to an accumulator 18. The deflector 12, baffle 14, and accumulator 18 together form a "coater cup" assembly. The bowl rinse hardware assembly comprises various structures such as a flange 20, an inlet subassembly 22, a backing plate 24, and a nozzle mount 26 having cleaning nozzles 28 attached thereto. In a typical system, the accumulator has a diameter of about 15.5 inches and the nozzle mount has a diameter of about 5.125 inches.

During coating of the wafer, excess photoresist is forced from the spinning wafer and onto the interior surface of the deflector 12. After coating a number of wafers, the deflector 12 is cleaned by ejecting (outputting) solvent 30 (FIGS. 1 and 2) from the nozzles 28 and onto the deflector 12. The track dispenses photoresist onto the wafer using a separate nozzle (not depicted) while the cleaning nozzles 28 dispense a photoresist cleaning solvent such as propylene glycol monomethyl ether acetate (PGMEA). In a typical configuration, the nozzle mount 26 has six cleaning nozzles attached thereto, as depicted in FIG. 2. The solvent rinses the excess resist from the interior surface of the deflector 12, and the solvent and resist flow down the deflector 12 through the gap 16 provided the deflector 12 and a baffle 14, and finally into the accumulator 18 where it is drained away into a larger waste collection system for disposal or recycling.

As depicted in FIGS. 1 and 2, solvent 30 is ejected from nozzles 28 using a flat, fan spray pattern. As depicted in FIG. 1, the fan spray exits the nozzle at a slight upward incline of about 15° to contact the deflector 12. Further, as depicted in the cross sectional top view of FIG. 2, the solvent 30 exits the nozzle horizontally at an angle 32, for example at an angle of about 90°. The solvent pattern should provide a continuous circle around the interior surface of the bowl so that interior locations of the deflector 12 are rinsed.

After several photoresist dispenses, the gap 16 provided by the deflector 12 and the baffle 14 can become blocked with resist, which can prevent the proper exhaust of resist and solvent through the gap and into the accumulator 18. As such, the coater process bowl assembly is periodically disassembled and sent out for cleaning. Manual cleaning is required after 96 continuous hours of use, and requires removal of the coater track system from production.

A coater process bowl system requiring less manual cleaning than previous designs would have reduced downtime, would require less technician time, and would therefore be less expensive to operate, thereby resulting in decreased production costs.

SUMMARY OF THE EMBODIMENTS

In one embodiment of the invention, a bowl rinse hardware assembly comprises a nozzle mount and a plurality of nozzles attached to the nozzle mount. Each nozzle comprises an opening therein shaped to eject solvent in a cone-shaped pattern in a direction toward at least one structure to be rinsed.

In a system for applying photoresist to a surface of a semiconductor wafer, the system comprises a bowl rinse hardware assembly comprising a nozzle mount and a plurality of nozzles each attached to the nozzle mount. In this embodiment, each nozzle has an opening therein and is shaped to eject solvent in a cone-shaped pattern in a direction toward a structure to be rinsed. Each nozzle ejects solvent downward at an angle greater than 0° and less than about 20° away from horizontal. The cone-shaped pattern has an angle of about 50°. The structure to be rinsed comprises a plurality of locations which receives direct spray from the nozzles. In this embodiment, each of the plurality of locations which receives direct spray from the nozzles receives direct spray from at least two nozzles.

In another embodiment, a method for cleaning a surface of a coater process bowl system comprises ejecting a solvent from a plurality of nozzles received by a nozzle mount, wherein the solvent ejected from the plurality of nozzles comprises a cone-shaped pattern. The solvent is ejected to directly contact both a baffle and a deflector which form an interior surface of the coater process bowl assembly.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

It should be noted that some details of the drawings have been simplified and are drawn to facilitate understanding of the inventive embodiments rather than to maintain strict structural accuracy, detail, and scale.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

Figure 3:
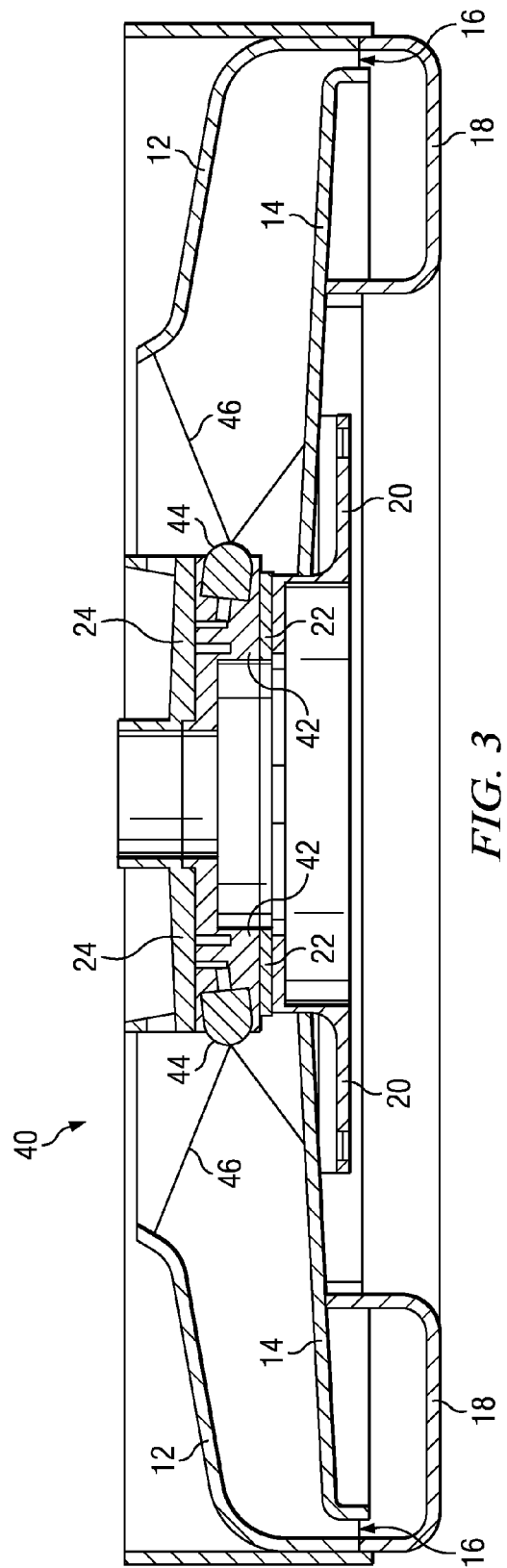
FIG. 3 is a cross section depicting a bowl rinse hardware assembly and a coater cup assembly in accordance with one embodiment of the invention.

FIG. 3 is a cross section depicting a coater track system comprising a coater process bowl assembly 40, which comprises a bowl rinse hardware assembly and a coater cup assembly. The coater cup assembly of FIG. 3 structure comprises a deflector 12, a baffle 14, a gap 16 formed by the deflector 12 and the baffle 14, and an accumulator 18. The bowl rinse hardware assembly comprises a flange 20, an inlet subassembly 22, a backing plate 24, a nozzle mount 42, and nozzles 44. The nozzle mount can be manufactured from solvent-resistant plastic such as machined DELRIN® acetal resin, while the nozzles can be manufactured from stainless steel and press fit into the nozzle mount.

The nozzles 44 eject a spray of solvent 46 having one or more of several features which provide an advantage over previous process bowl spray patterns.

The inventors have determined that a possible cause for blockage of the gap 16 as described above is that excess resist can build up on the inclined baffle 14. It has further been determined that inefficient cleaning by the fan spray is at least partially responsible for this buildup. The fan spray of conventional designs is concentrated on the deflector, and does not clean the baffle.

One feature of an embodiment of the inventive nozzle and its spray pattern is that the nozzle is shaped to eject solvent in a cone-shaped pattern, rather than a planar fan shape of conventional designs. While conventional designs concentrate the fan pattern onto only the deflector 12, the cone shape allows simultaneous, direct cleaning of both the deflector 12 and the baffle 14. The cone-shaped spray 46 from an opening in the nozzle is directed toward both the deflector 12 and the baffle 14 as depicted in FIG. 3. With a cone-shaped spray, the force and flow of the solvent is more evenly distributed toward the gap than is found with a fan spray which is aimed toward only the deflector.

Figure 1:
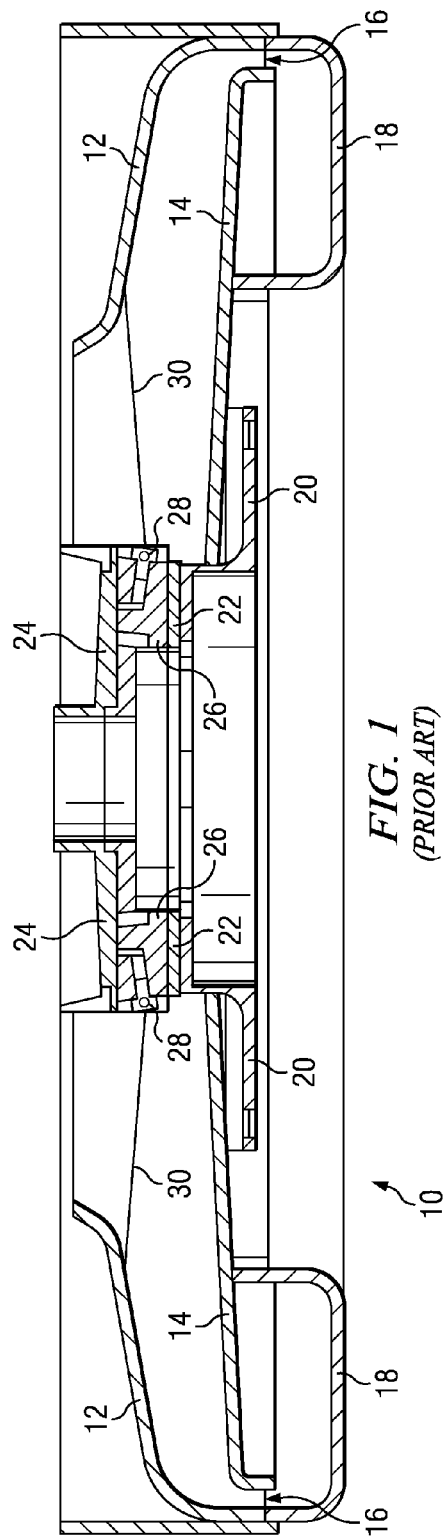
FIG. 1 is a cross section depicting conventional coater process bowl assembly comprising a bowl rinse hardware assembly and a coater cup assembly which is part of a coater track system.
Figure 4:
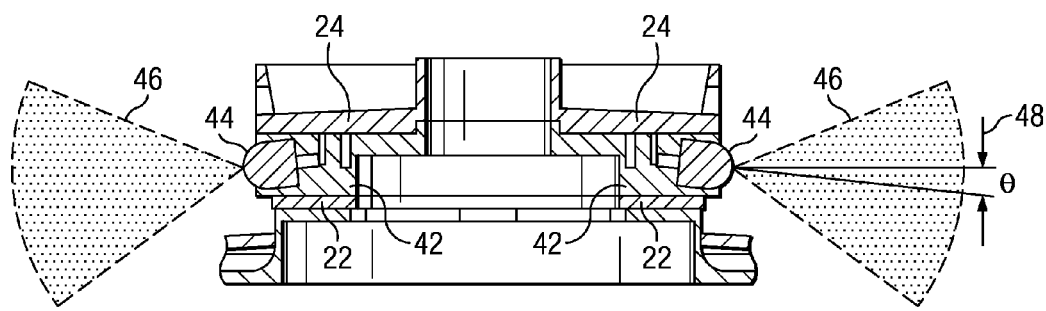
FIG. 4 is a cross section depicting a bowl rinse hardware assembly in accordance with another embodiment of the invention.

The inventors have also determined that directing the spray upward as is found with conventional designs (30, FIG. 1) does not provide efficient cleaning of material. Another feature of an inventive embodiment is that the nozzles eject solvent, for example in the cone shape as described above, at a slight downward angle so that a majority of the solvent is directed toward the more horizontally oriented baffle than toward the more vertically oriented deflector. FIG. 4 depicts the bowl rinse hardware assembly comprising nozzles 44 positioned to eject a conical spray 46 at a downward angle 48. A downward cone angle (angle away from horizontal of the cone axis) of theta ($\Theta$), where $0°<\Theta\leqq20°$, and more particularly where $3°\leqq\Theta\leqq15°$, and most particularly where $10°\leqq\Theta\leqq20°$, for example about 15°, would be sufficient. Directing spray horizontally or upward reduces the flow of solvent across the baffle 14, and can contribute to material buildup and blockage of the gap 16 provided by the deflector 12 and the baffle 14.

Figure 2:
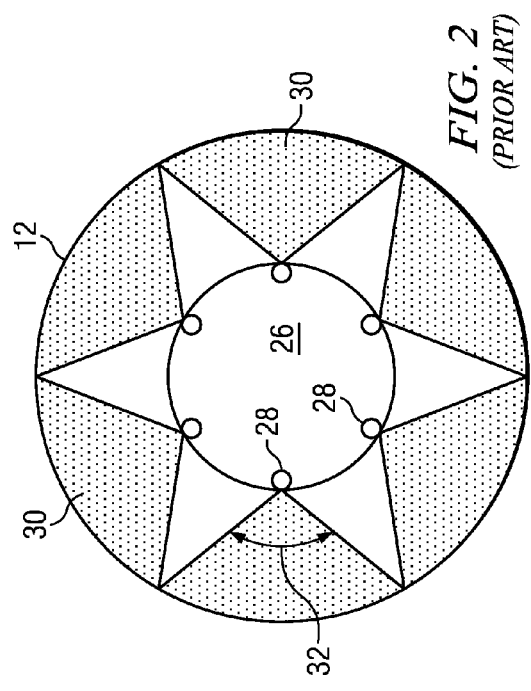
FIG. 2 is a cross sectional top view of a bowl rinse apparatus ejecting solvent in a flat fan pattern from a plurality of nozzles.
Figure 5:
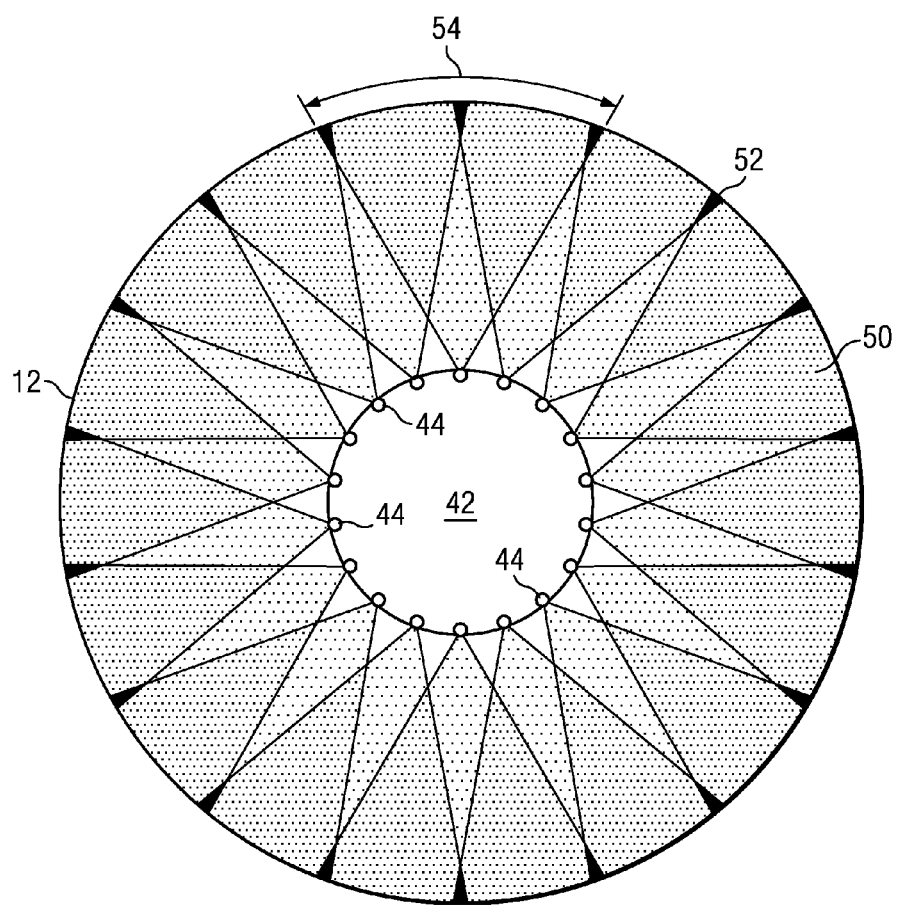
FIG. 5 is a cross sectional top view of a coater process bowl assembly ejecting solvent in a pattern in accordance with an embodiment of the invention.

Additionally, the inventors have realized that the conventional fan spray pattern as depicted in FIG. 2 has no spray overlap (i.e., no "overspray"), and that the conventional design is configured such that each location on the interior of the deflector 12 receives spray from only one nozzle. Thus it is another feature of an embodiment of the invention that interior locations which receive direct spray from the nozzles receive spray from at least two nozzles. This provides bowl rinse hardware which more efficiently cleans surfaces of the deflector 12 and baffle 14 than is found with conventional systems, and decreases blockage of the gap 16. FIGS. 4 and 5 depict a cross-sectional and top views of the nozzle mount 42, nozzles 44, deflector 12, and the spray pattern of one inventive embodiment in which first interior locations 50 of the deflector 12 receive spray from two nozzles 44, while other, second interior locations 52 receive spray from three nozzles 44. The overspray can be controlled through the number of nozzles 44, the spray angle 54 (i.e., cone aperture angle), and by changing the pressure of the solvent through the nozzle. Using an increase in pressure alone, the spray angle 54 of the solvent can be increased by up to 20° (10° on each side). In other words, even though the nozzle may be designed to output, for example, a 50° spray angle, the effective output angle can be increased to 70° by increasing the pressure of the solvent delivered to the nozzle. The FIG. 5 embodiment depicts a structure with 18 nozzles each designed with a 50° spray angle which has been increased to 60° through an increased pressure delivery of the solvent to the nozzles.

The cone spray angle, the number of nozzles, the positioning and spacing of the nozzles, the pressure through the nozzles, and the diameter of both the nozzle mount and the deflector all determine the overlap provided by the spray against the deflector and the baffle. The application of spray to the interior of the deflector from at least two nozzles can result from at least doubling the number of nozzles found with conventional designs (to 12 or more nozzles from six found with conventional systems, for example 18 nozzles as depicted), increasing the pressure of the solvent through the nozzles, and/or altering the spray angle found with conventional systems. In the embodiment of FIG. 5, the opening in each nozzle received by the nozzle mount points generally away from the nozzle mount to eject solvent outward away from the nozzle mount. Each nozzle 44 can eject a cone spray over an angle 54 of about 50° to about 54°, while the nozzles of FIG. 2 output the fan spray at an angle of about 90°.

Additionally, it is evident from the FIG. 5 embodiment that the number of nozzles can be increased to more than 12. With more nozzles, or by increasing the spray angle 54 with 12 or fewer nozzles, it is possible for interior deflector locations which receive direct spray to receive direct spray from at least two nozzles, or from at least three (or more) nozzles.

Thus various embodiments of the bowl rinse hardware, which can be a subassembly of a track system, provides more efficient cleaning by directly rinsing the deflector and the baffle using solvent ejected from more than one nozzle. Downtime of the track system can be decreased by about 2% or more. Manual cleaning, which was previously performed after every 96 hours of operation, can be decreased to once every month, or longer. Additionally, due to more efficient cleaning, it is possible that the solvent volume used during cleaning can be decreased from conventional designs. Further, decreasing downtime can reduce qualification frequencies, which in turn decreases photoresist costs and, therefore, overall device costs.

While various embodiments describe bowl rinse hardware as part of a track system, it is contemplated that the bowl rinse hardware can be used with other types of systems, for cleaning materials other than excess photoresist from one or more structures other than a deflector and/or baffle, or as a stand-alone system.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including." "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A system for applying photoresist to a surface of a semiconductor wafer, the system comprising a bowl rinse hardware assembly comprising:
    a nozzle mount; and
    a plurality of nozzles each attached to the nozzle mount, wherein each nozzle has an opening therein and is shaped to eject solvent in a direction toward one or more structures to be rinsed in a cone-shaped pattern having an axis directed downwardly at an angle greater than 0° and less than about 20° from horizontal, wherein the cone-shaped pattern has an aperture angle of about 50°, wherein the one or more structures to be rinsed comprises a plurality of locations which receive direct spray from the nozzles, and wherein each of the plurality of locations which receives direct spray from the nozzles receives direct spray simultaneously from at least two nozzles.

2. The system of claim 1, wherein the one or more structures to be rinsed comprises:
    a deflector;
    a baffle; and
    a gap provided by a separation between the baffle and the deflector;
    wherein each nozzle is directed to eject solvent toward both the deflector and the baffle.

3. The system of claim 1, wherein each nozzle is positioned to eject solvent in a cone-shaped pattern having an axis directed downwardly at an angle of 15° from horizontal.

4. The system of claim 1, wherein the bowl rinse hardware assembly is part of a coater process bowl assembly, wherein the coater process bowl assembly further comprises:
    a deflector; and
    a baffle, wherein a separation between the baffle and the deflector forms a gap and each nozzle is directed to eject solvent toward both the deflector and the baffle.

5. The system of claim 4, wherein the deflector comprises a plurality of interior locations which receive direct spray from the nozzles, and wherein each of the plurality of locations which receives direct spray from the nozzles receives direct spray simultaneously from at least two nozzles.

6. The system of claim 5, wherein each of the plurality of locations which receive direct spray from the nozzles receives direct spray simultaneously from at least three nozzles.

7. A system for applying a coating to a surface of a semiconductor wafer, comprising:
    a coater process bowl assembly including a generally horizontally directed deflector, and a baffle located inwardly above the deflector and converging outwardly and downwardly towards a horizontal spacing across a gap from the deflector; and
    a bowl rinse hardware assembly including a nozzle mount for rotational movement relative to the coater process bowl assembly, and a plurality of nozzles attached to the nozzle mount;
    wherein each nozzle is shaped to eject rinsing liquid in a cone-shaped spray pattern directed simultaneously directly onto both the deflector and baffle, and directed downwardly so that a majority of the spray is directed toward the baffle; and
    wherein the nozzles are positioned so that interior locations receive direct spray simultaneously from at least two nozzles.

8. The system of claim 7, wherein first interior locations of the deflector receive directly spray simultaneously from at least two nozzles and second interior locations of the deflector receive spray from at least three nozzles.

9. The system of claim 7, wherein each nozzle is shaped so the cone-shaped spray pattern has an axis directed downwardly at an angle greater than 0° and less than about 20° from horizontal.

10. The system of claim 9, wherein each nozzle is shaped so that pressure can be applied to eject the rinsing liquid in the cone-shaped spray pattern at an aperture angle of about 50° to 54°.

11. The system of claim 7, wherein the nozzle mount comprises solvent-resistant plastic, and the nozzles are stainless steel members that press-fit into the nozzle mount.

12. The system of claim 7, wherein the plurality of nozzles comprises 18 nozzles each designed to provide a cone-shaped spray pattern having a 50° aperture angle.

13. The system of claim 7, wherein the bowl rinse hardware assembly further comprises a generally horizontally and outwardly directed flange located below the baffle, and a backing plate located above the nozzle mount.

14. A method for applying a rinsing liquid to clean a system for applying a coating to a surface of a semiconductor wafer, comprising:
   providing a coater process bowl assembly including a generally horizontally directed deflector, and a baffle located inwardly above the deflector and converging outwardly and downwardly towards a horizontal spacing across a gap from the deflector;
   providing a bowl rinse hardware assembly including a nozzle mount for rotational movement relative to the coater process bowl assembly, and a plurality of nozzles attached to the nozzle mount; wherein each nozzle is shaped to ejected rinsing liquid in a cone-shaped spray directed simultaneously directly onto both the deflector and the baffle, and directed downwardly so that a majority of the spray is directed toward the baffle;
   rotating the nozzle mount relative to the coater process bowl assembly; and
   ejecting a rinsing liquid from each nozzle;
   whereby the rinsing liquid is ejected in a cone-shaped spray pattern directed simultaneously directly onto both the deflector and baffle, and directed downwardly so that a majority of the spray is directed toward the baffle; and
   wherein the nozzles are positioned so that interior locations receive direct spray simultaneously from at least two nozzles.

15. The method of claim 14, wherein first interior locations of the deflector receive directly spray simultaneously from at least two nozzles and second interior locations of the deflector receive spray from at least three nozzles.

16. The method of claim 14, wherein each nozzle directs the cone-shaped spray pattern with an axis directed downwardly at an angle greater than 0° and less than about 20° from horizontal.

17. The system of claim 16, wherein each nozzle directs the cone-shaped spray pattern at an aperture angle of about 50° to 54°.

* * * * *